(12) United States Patent
Tuan et al.

(10) Patent No.: US 8,304,660 B2
(45) Date of Patent: Nov. 6, 2012

(54) FULLY REFLECTIVE AND HIGHLY THERMOCONDUCTIVE ELECTRONIC MODULE AND METHOD OF MANUFACTURING THE SAME

(75) Inventors: Wei-Hsing Tuan, Taipei (TW);
Shao-Kuan Lee, Taipei (TW)

(73) Assignee: National Taiwan University, Taipei (TW)

( * ) Notice: Subject to any disclaimer, the term of this patent is extended or adjusted under 35 U.S.C. 154(b) by 278 days.

(21) Appl. No.: 12/769,889

(22) Filed: Apr. 29, 2010

(65) Prior Publication Data
US 2010/0212942 A1 Aug. 26, 2010

Related U.S. Application Data

(63) Continuation-in-part of application No. 12/027,643, filed on Feb. 7, 2008, now Pat. No. 7,746,644.

(30) Foreign Application Priority Data

Mar. 12, 2010 (TW) ................................ 99107276 A

(51) Int. Cl.
*H05K 1/00* (2006.01)
(52) U.S. Cl. ........ 174/258; 361/708; 361/746; 361/748; 361/751; 174/257; 257/98; 257/703
(58) Field of Classification Search .................. None
See application file for complete search history.

(56) References Cited

U.S. PATENT DOCUMENTS

| 5,698,896 | A | 12/1997 | Komatsu et al. |
| 6,134,776 | A | 10/2000 | Hoffmeyer |
| 6,428,189 | B1 | 8/2002 | Hochstein |
| 6,670,751 | B2 | 12/2003 | Song et al. |
| 6,690,087 | B2 | 2/2004 | Kobayashi et al. |
| 6,835,960 | B2 * | 12/2004 | Lin et al. ........................ 257/81 |
| 6,860,621 | B2 | 3/2005 | Bachl et al. |
| 6,874,910 | B2 | 4/2005 | Sugimoto et al. |
| 6,949,772 | B2 | 9/2005 | Shimizu et al. |
| 7,072,096 | B2 * | 7/2006 | Holman et al. ............... 359/298 |
| 7,217,998 | B2 | 5/2007 | Tamagawa et al. |
| 7,258,808 | B2 | 8/2007 | Kwon et al. |
| 7,259,457 | B2 | 8/2007 | Zhang et al. |
| 7,345,322 | B2 | 3/2008 | Kikuchi |
| 7,550,319 | B2 | 6/2009 | Wang et al. |
| 7,746,644 | B2 | 6/2010 | Tuan |
| 2005/0035364 | A1 * | 2/2005 | Sano et al. ..................... 257/99 |
| 2006/0018120 | A1 | 1/2006 | Linehan et al. |
| 2007/0057364 | A1 * | 3/2007 | Wang et al. ................... 257/701 |
| 2007/0200127 | A1 * | 8/2007 | Andrews et al. ............... 257/98 |
| 2009/0315057 | A1 | 12/2009 | Konishi et al. |
| 2011/0227199 | A1 * | 9/2011 | Hata et al. ..................... 257/616 |

FOREIGN PATENT DOCUMENTS

| CN | 101439984 A | 5/2009 |
| CN | 101614339 A | 12/2009 |

* cited by examiner

*Primary Examiner* — Courtney Smith
(74) *Attorney, Agent, or Firm* — Muncy, Geissler, Olds & Lowe, PLLC

(57) ABSTRACT

A fully reflective and highly thermoconductive electronic module includes a metal bottom layer, a transparent ceramic layer and a patterned metal wiring layer. The metal bottom layer has a lower reflective surface. The transparent ceramic layer has an upper surface and a lower surface. The lower surface of the transparent ceramic layer is bonded to the lower reflective surface of the metal bottom layer. The metal wiring layer is bonded to the upper surface of the transparent ceramic layer. The lower reflective surface reflects a first light ray, transmitting through the transparent ceramic layer, to the upper surface of the transparent ceramic layer. A method of manufacturing the fully reflective and highly thermoconductive electronic module is also disclosed.

16 Claims, 8 Drawing Sheets

FULLY REFLECTIVE AND HIGHLY THERMOCONDUCTIVE ELECTRONIC MODULE AND METHOD OF MANUFACTURING THE SAME

This application is a Continuation-in-Part of application Ser. No. 12/027,643, filed on Feb. 7, 2008, now issued as U.S. Pat. No. 7,746,644, and for which priority is claimed under 35 U.S.C. §120; and this application claims priority of Application No. 099107276 filed in Taiwan, R.O.C. on Mar. 12, 2010 under 35 U.S.C. §119, the entire contents of all of which are hereby incorporated by reference.

BACKGROUND OF THE INVENTION

1. Field of the Invention

The present invention relates to a fully reflective and highly thermoconductive electronic module and a method of manufacturing the same.

2. Related Art

Heat is generated when a light-emitting diode (LED) is operating with electrons flowing therethrough. The generation of heat increases the resistance and affects the flows of the electrons so that the function of the LED is significantly influenced. When the technology of manufacturing the LED is greatly enhanced, a line width in the LED is getting smaller and smaller, and the line density in the LED is getting higher and higher. Thus, the heat generated by the LED is increased rapidly. Taking the high-luminance LED as an example, its thermal density is higher than or equal to 100 W/cm$^2$. Thus, the heat dissipating ability of the substrate contacting with the LED is a key factor for determining whether the LED can operate normally or not.

A typical power component, such as a solid relay, is similar to the CPU of the computer and generates a lot of heat. Thus, the power component also dissipates the heat rapidly through the substrate contacting therewith so that it can operate normally.

At present, the LED has been applied to the lighting. However, the major barrier on the applications of the LED as the light source is that the LED cannot survive at an elevated temperature. Generally speaking, the temperature of the LED cannot exceed 90° C. If the temperature of the LED is higher than 90° C., the luminance thereof rapidly deteriorates. So, the rapid heat dissipating ability of the heat dissipation substrate in contact with the LED has become a greatest challenge for determining whether the LED can become the illumination light source or not. It is widely accepted that the development of the heat dissipating substrate has played an important role on the applications of the LED as the light source.

In order to satisfy the miniaturized requirement of the LED, the substrate contacting with the LED has to satisfy the following fundamental requirements.

First, the material must have a high thermal conductivity to dissipate the heat rapidly.

Second, the material must have the high resistivity in order to prevent the P and N electrodes of the LED from being short-circuited.

Third, the substrate must direct all the light rays emitted from the LED toward the front side of the LED after the above-mentioned conditions are satisfied, such that the effective luminance toward the front side of the LED can be increased.

Recently, various color LEDs have been gradually developed, wherein the successful development of the white-light LED has attracted considerable attention. This is because the white-light LED can serve as a light source for an illumination lamp. One of the bottleneck in the LED illumination technology is the heat dissipating problem. If the heat cannot be rapidly dissipated, the temperature of the LED chip becomes too high, the light emitting efficiency of the LED chip is lowered, and the lifetime of the LED chip is shortened. The LED chip may be mounted on the heat dissipating substrate. The major function of the substrate is to dissipate the heat to the heat dissipating fins or heat pipes.

In addition, because the LED chip has P and N electrodes, the substrate in contact with the LED chip also needs to have the separate lines to connect to the P and N electrodes independently. At present, all the available heat dissipating substrates, such as FR4 and MCPCB substrates, may provide the electroconductive requirement. However, the heat dissipating abilities of the two heat dissipating substrates have the significant difference. For example, the thermal conductivities of the two heat dissipating substrates as measured by the flash method are listed in Table 1.

TABLE 1

| Heat dissipating substrate | Thermal conductivity (W/mK) |
|---|---|
| FR4 (Flame Retardant 4) | ~0.4 |
| MCPCB (Metal Core Printed Circuit Board) | ~3 |

For all the heat dissipating substrates for the LED chips, the thermal conductivity still must be enhanced to deal with the heat dissipating requirements of the LED chips with the higher power. Furthermore, the problem of light reflection should also be addressed. At the moment, all the available heat dissipating substrates are not able to cope with the optical, electrical and thermal requirements simultaneously.

Electrons and holes in the P-N junction of the LED chip react with each other to release light rays, which travel everywhere due to scattering and reflecting. Thus, only a portion of light rays can travel in the frontward direction of the LED chip and become the useful light source. Thus, when the LED chip or lamp is being packaged, chemical or physical coating often has to be applied to the peripheral surfaces by way of, for example, chemical vapor deposition (CVD), physical vapor deposition (PVD), or the like. So, the reflective metal layer may be coated thereon to increase the effective light intensity. Alternatively, it is possible to apply a metal layer to the heat dissipating substrate and thus to enhance the light reflecting ability of the heat dissipating substrate. For example, Wang et al. disclosed a low temperature co-fired ceramic (LTCC) tape compositions, light emitting diode (LED) modules, lighting devices and a method of forming thereof in U.S. Pat. No. 7,550,319, wherein the ink containing silver and glass is printed on the ceramic substrate by way of screen printing, and then the silver is combined with the ceramic substrate by way of co-firing. Because the silver can reflect the light, the reflecting function may be provided. However, the cost of such technique is very high.

SUMMARY OF THE INVENTION

It is therefore an objective of the present invention to provide a fully reflective and highly thermoconductive electronic module and a method of manufacturing the same, wherein the optical, electrical and thermal requirements may be addressed simultaneously.

The present invention achieves the above-identified objective by providing a fully reflective and highly thermoconductive electronic module including a metal bottom layer, a transparent ceramic layer and a patterned metal wiring layer. The metal bottom layer has a lower reflective surface. The transparent ceramic layer has an upper surface and a lower surface. The lower surface of the transparent ceramic layer is bonded to the lower reflective surface of the metal bottom layer. The patterned metal wiring layer is disposed on the upper surface of the transparent ceramic layer. The lower reflective surface reflects a first light ray, transmitting through the transparent ceramic layer, then transmit to the front side of the module.

The present invention further provides a method of manufacturing a fully reflective and highly thermoconductive electronic module. The method includes the steps of: grinding and oxidizing a metal bottom layer to make the metal bottom layer have a lower reflective surface; providing a patterned metal wiring layer; interposing a transparent ceramic layer between the metal wiring layer and the metal bottom layer to form an assembly; and placing the assembly in a high-temperature environment to make the transparent ceramic layer bond the metal bottom layer and the metal wiring layer together. Thus, it is possible to enhance the heat dissipating ability and the light reflection ability, and to provide the electrical connection.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
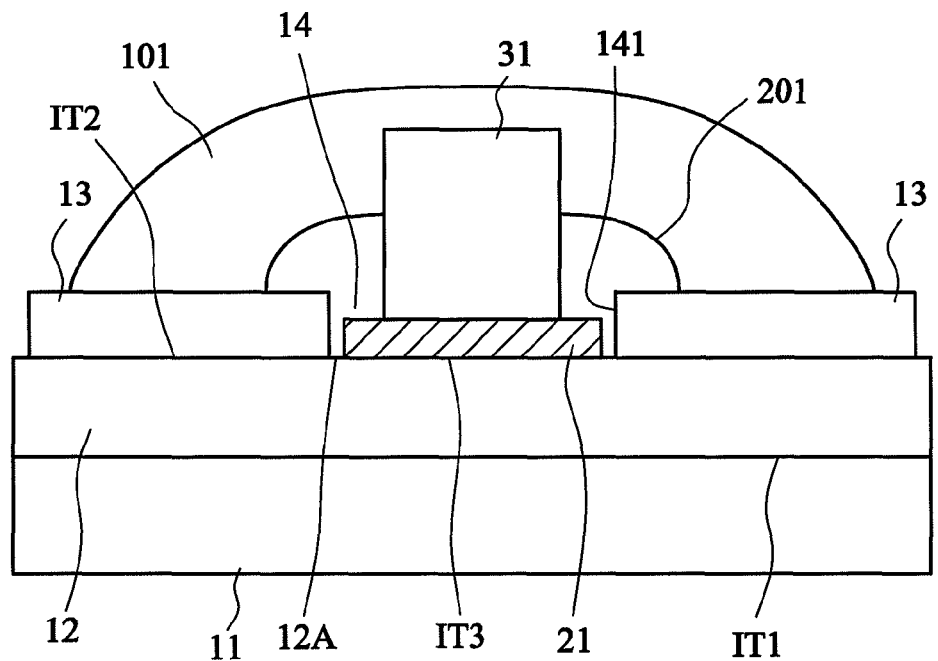
FIG. 1 is a side view showing a package assembly according to a first embodiment of the invention.
Figure 2:
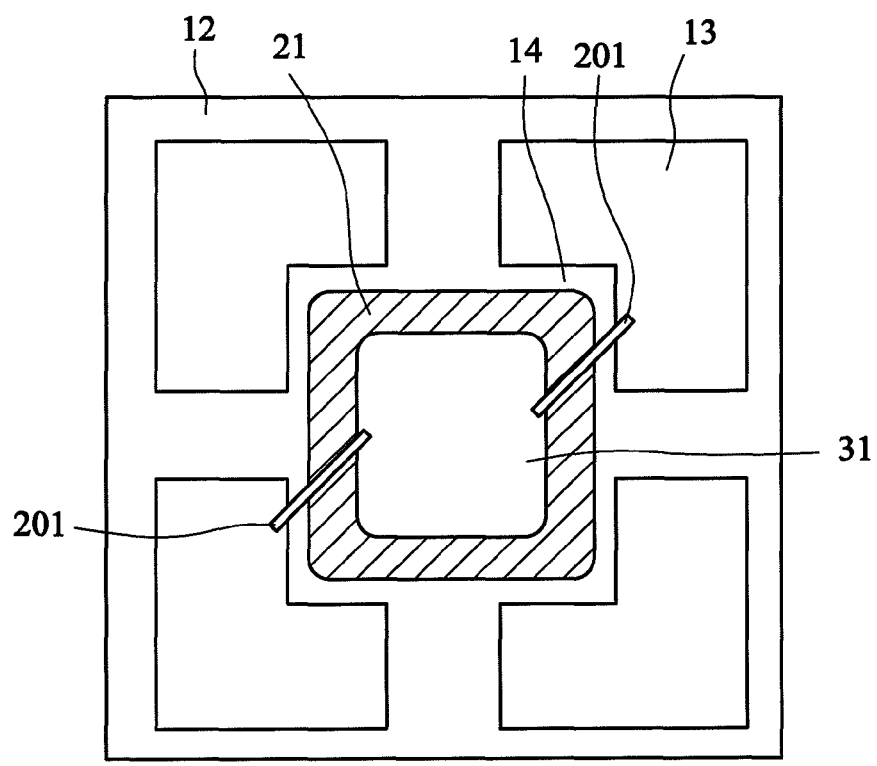
FIG. 2 is a top view showing the package assembly of FIG. 1.

The invention provides an improved thin package assembly with a heat dissipating structure. FIG. 1 is a side view showing a package assembly according to a first embodiment of the invention. FIG. 2 is a top view showing the package assembly of FIG. 1. Referring to FIGS. 1 and 2, the package assembly of this embodiment includes a thermal conductive lower metal layer 11, an electric insulating ceramic layer 12, a patterned upper metal layer 13 and an electronic component 31.

The electric insulating ceramic layer 12 is disposed on and bonded to the thermal conductive lower metal layer 11. The patterned upper metal layer 13 is disposed on and bonded to the electric insulating ceramic layer 12. The patterned upper metal layer 13 is a single-layered metal layer and has an opening 14 from which the electric insulating ceramic layer 12 is exposed. The electronic component 31 is disposed in the opening 14 of the patterned upper metal layer 13 and mounted on the electric insulating ceramic layer 12 through a thermally conductive adhesive or solder 21. The thermally conductive adhesive 21 and the patterned upper metal layer 13 are disposed on a top surface 12A of the electric insulating ceramic layer 12. In this embodiment, a sidewall of the opening 14 has a vertical surface 141. The thermal conductive lower metal layer 11, the electric insulating ceramic layer 12 and the patterned upper metal layer 13 constitute the heat dissipating structure.

The thermal conductive lower metal layer 11 may be made of copper and has a thickness ranging from 0.1 to 5 mm, for example. The electric insulating ceramic layer 12 is made of aluminum oxide or aluminum nitride and has a thickness ranging from 0.1 to 5 mm, for example. The patterned upper metal layer 13 is entirely made of the copper and has an electric connection point or a plurality of electric connection points. The patterned upper metal layer 13 has a thickness also ranging from 0.05 to 5 mm and has thermal conductive and electroconductive properties.

The electronic component 31 may be a central processing unit (CPU), a light-emitting diode (LED) or a power component, and is electrically connected to the patterned upper metal layer 13. There are many ways for electrically connecting the patterned upper metal layer 13 to the electronic component 31. In this example, the package assembly further includes a plurality of wires 201 electrically connected to the electronic component 31 and the patterned upper metal layer 13. The package assembly may further include a package material 101 applied to the patterned upper metal layer 13, the electronic component 31, the thermally conductive adhesive 21 and the wires 201 to encapsulate and protect the patterned upper metal layer 13, the electronic component 31, the thermally conductive adhesive 21 and the wires 201. Currents may flow through the wires 201 to power the electronic component 31.

The thickness of the heat dissipating structure may range from 0.3 to 15 mm. Many metal materials have the good thermal conductivity, wherein the silver material has the best thermal conductivity but the higher price. Among these materials, the copper material is the best choice under the consideration of the heat dissipating requirement and the cost-down requirement. As listed in Table 2, the coefficient of thermal conductivity of copper may reach 400 W/mK, and the thermal conductive lower metal layer 11 of the package assembly of the invention is made of the copper.

TABLE 2

| Material | Coefficient of thermal conductivity (W/mK) | Resistivity (Ω-cm) |
| --- | --- | --- |
| Copper | 400 | $10^{-6}$ |
| Aluminum | 150 to 230 | $10^{-5}$ |
| Aluminum oxide | 20 to 38 | $>10^{14}$ |
| Aluminum nitride | 170 to 230 | $>10^{14}$ |
| Epoxy resin | 0.3 | $10^{14}$ |
| Thermally conductive adhesive | 1 to 6 | $<10^{14}$ |

Many materials, such as most polymeric organic materials or most ceramic materials, have the electric insulating property, as shown in Table 2. However, the ceramic material is the best choice under the consideration of the heat dissipating, the moisture isolating and the long-term reliability. The ceramic materials with the high thermal conductivity and the high insulating property include aluminum oxide having the coefficient of thermal conductivity ranging from 20 to 38 W/mK, and aluminum nitride having the coefficient of thermal conductivity ranging from 170 to 230 W/mK. The coefficient of thermal conductivity of the ceramic material has the wider range because the coefficient of thermal conductivity is greatly influenced by the purity and the co-firing additive of the ceramic material. However, the resistivity of each of the aluminum oxide and the aluminum nitride is higher than $10^{14}$ Ω-cm, so the two ceramic materials have the good electric insulating property. Also, the aluminum oxide and the aluminum nitride further have the advantages of the low dielectric constant and the high dielectric strength, so the electric insulating ceramic layer 12 is made of aluminum oxide or aluminum nitride in the package assembly of the invention.

As mentioned hereinabove, the copper has the excellent heat conductivity. In addition, the resistivity of the copper is extremely low. So, the heat dissipating structure of the invention is very thin, and the patterned upper metal layer 13 may also be made of the thermal conductive and electroconductive material, as shown in Table 2. The copper material is still the best choice for the patterned upper metal layer 13 under the consideration of the cost. The patterned upper metal layer 13 may be formed by etching and may serve as a portion of the circuit of the package assembly.

Figure 3:
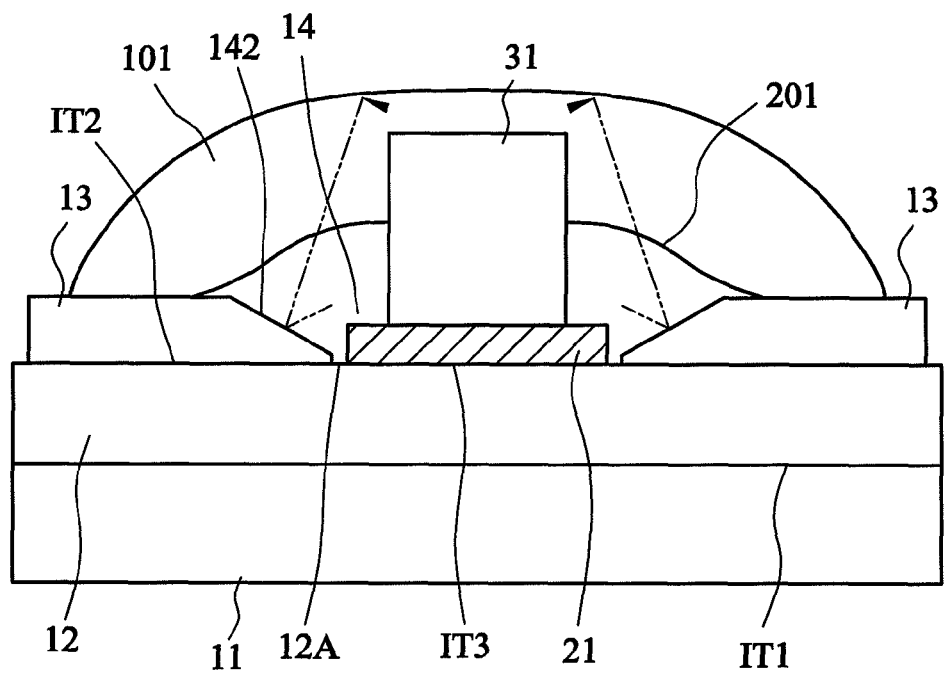
FIG. 3 is a side view showing a package assembly according to a second embodiment of the invention.
Figure 4:
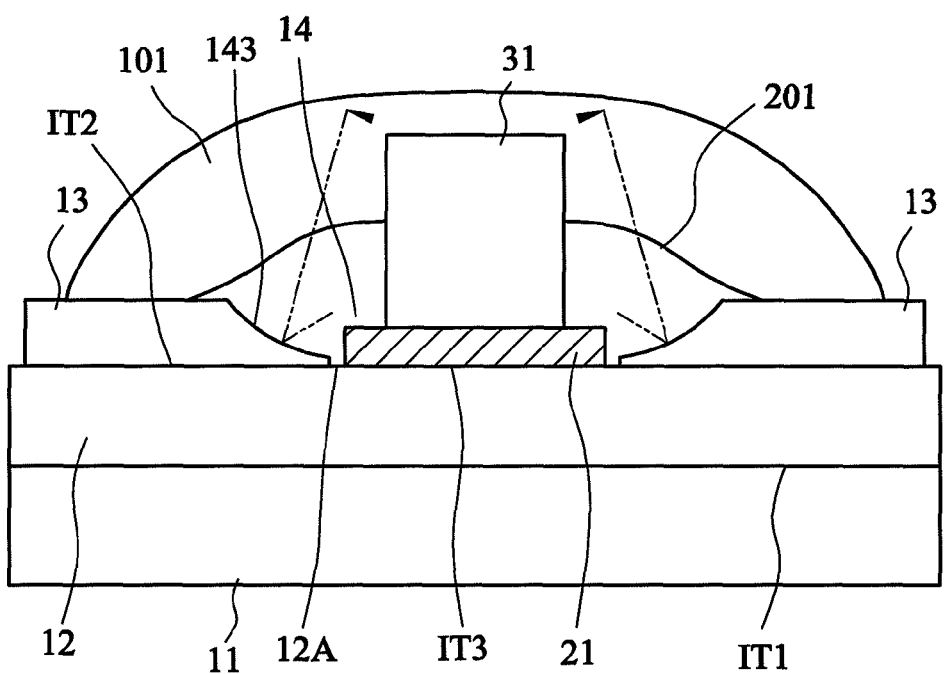
FIG. 4 is a side view showing a package assembly according to a third embodiment of the invention.

FIG. 3 is a side view showing a package assembly according to a second embodiment of the invention. As shown in FIG. 3, a sidewall of the opening 14 has an inclined surface 142 for reflecting light rays emitted from the electronic component (e.g., LED) 31. FIG. 4 is a side view showing a package assembly according to a third embodiment of the invention. As shown in FIG. 4, a sidewall of the opening 14 has a curved surface 143 for reflecting light rays emitted from the electronic component (e.g., LED) 31.

The aluminum oxide, the aluminum nitride or the copper has the high rigidity, so the package assembly also has the higher rigidity. In order to mount the CPU, the power component or the LED 31 on the electric insulating ceramic layer 12, the thermally conductive adhesive or solder 21 is disposed therebetween. The thermally conductive adhesive is composed of an organic polymeric material and a metal or ceramic filler material mixed together. The metal or ceramic filler material is selected from the group consisting of silver particles, copper particles, aluminum particles, aluminum oxide particles, aluminum nitride particles, boron nitride particles or titanium boride particles. This is because the polymeric organic material, such as the epoxy resin in Table 2, typically has the coefficient of thermal conductivity substantially equal to 0.3 W/mK. So, the metal or ceramic particles, such as silver (Ag), copper (Cu), aluminum, silicon (Si), aluminum oxide ($Al_2O_3$), aluminum nitride (AlN), boron nitride (BN) or titanium boride ($TiB_2$) particles having the higher coefficient of thermal conductivity, are added to the polymeric organic material. In order to satisfy the requirement of the adhesive property and the cost-down requirement, the added metal or ceramic particles with the higher coefficient of thermal conductivity have a predetermined upper bound. In this case, the coefficient of thermal conductivity of the thermally conductive adhesive can be equal to or less than 3 W/mK. The component 31 can also be bonded onto the layer 12 through soldering using the solder. The solder may be made of a tin (Sn) alloy or a silver (Ag) alloy.

Figure 5:
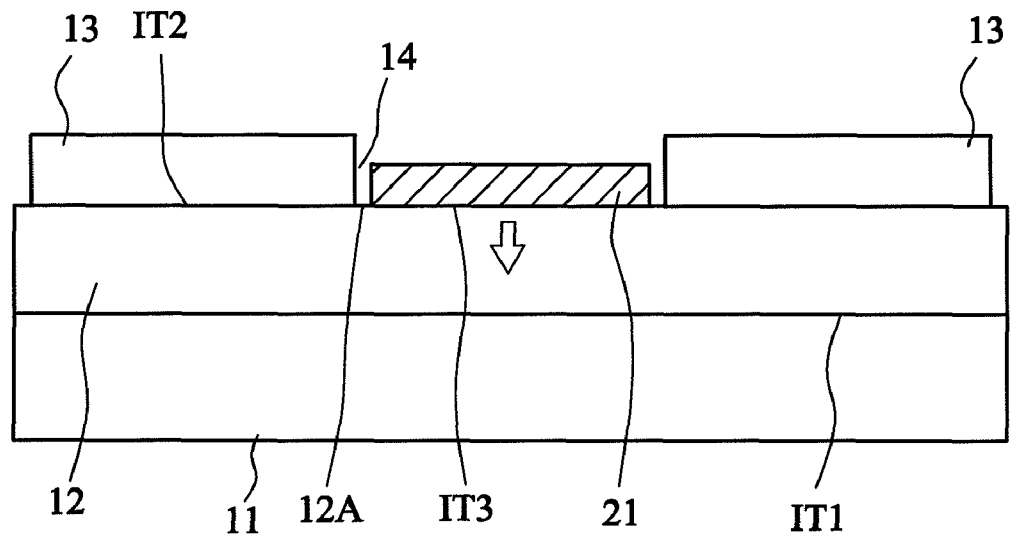
FIG. 5 is a schematic illustration showing a current flowing direction in the package assembly of the invention.

The heat dissipating structure of the invention has three layers, and the total electric resistance of the three-layer structure in the vertical direction is determined by the materials of the three layers. FIG. 5 is a schematic illustration showing a current flowing direction, indicated by the arrow, in the package assembly of the invention. As shown in FIG. 5, the total electric resistance of the heat dissipating structure is equal to a sum of electric resistances of the first to third layers 11 to 13 under the precondition of the larger plane size because a serial structure is formed. That is, $$ER_{total} = ER_1 + ER_2 + ER_3 \quad (1),$$

wherein $ER_{total}$ denotes the total electric resistance, $ER_1$ denotes the electric resistance of the first layer 11, $ER_2$ denotes the electric resistance of the second layer 12, and $ER_3$ denotes the electric resistance of the third layer 13.

As shown in Equation (1), the total electric resistance is mainly determined by the electric resistance of the material having the highest electric resistance, and the electric resistance of each layer is determined by the electric resistivity and the size of the material layer, as shown in the following equation:

$$\text{(electric resistance)} = \text{(electric resistivity} \times \text{thickness)} / \text{(area)} \quad (2).$$

According to the Equations (1) and (2), the electric resistivity of the aluminum oxide or aluminum nitride is much higher than that of the copper, so the total electric resistance of the heat dissipating structure in the vertical direction is determined by the thickness of the aluminum oxide or aluminum nitride. The minimum thickness of the electric insulating ceramic layer 12 is about 0.1 mm, but the total electric resistance of the heat dissipating structure may be equal to or greater than $10^{10} \Omega$.

Figure 6:
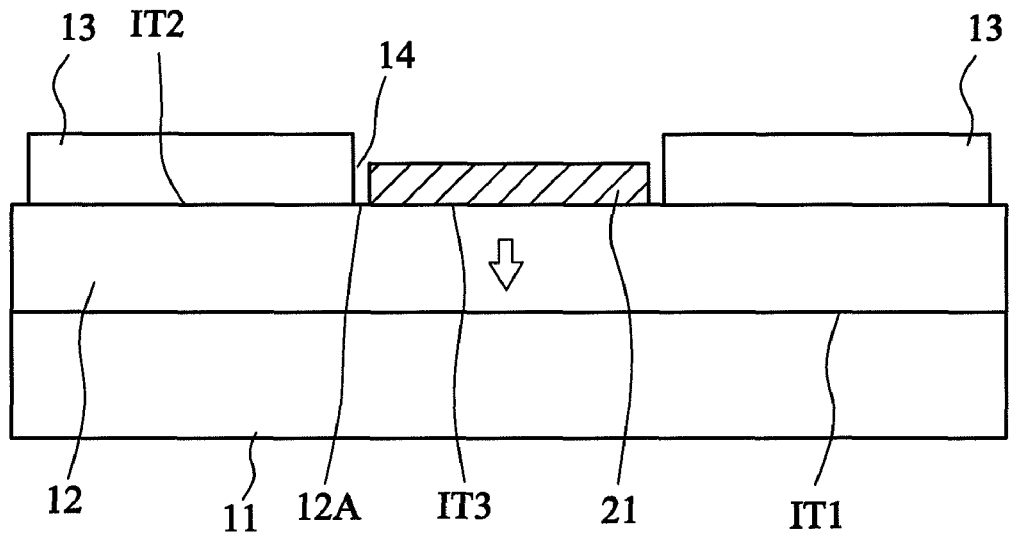
FIG. 6 is a schematic illustration showing a heat flowing direction in the package assembly of the invention.

FIG. 6 is a schematic illustration showing a heat flowing direction, indicated by the arrow, in the package assembly of the invention. As shown in FIG. 6, the total thermal resistance of the heat dissipating structure is equal to a sum of thermal resistances of the first to third layers under the precondition of the larger plane size because a serial structure is formed. That is, $$TR_{total} = TR_1 + TR_{IN1} + TR_2 + TR_{IN2} + TR_3 \quad (3),$$

wherein $TR_{total}$ denotes the total thermal resistance, $TR_1$ denotes the thermal resistance of the first layer 11, $TR_{IN1}$ denotes the thermal resistance of the first interface IT1 between the first layer 11 and the second layer 12, $TR_2$ denotes the thermal resistance of the second layer 12, $TR_{IN2}$ denotes the thermal resistance of the second interface IT2 between the second layer 12 and the third layer 13, and $TR_3$ denotes the thermal resistance of the third layer 13.

The thermal resistance of each layer is determined by the thermal resistivity and the size of the material layer, as shown in the following equation:

$$\text{(thermal resistance)} = \text{(thermal resistivity} \times \text{thickness)} / \text{area} \quad (4).$$

According to the heat dissipating structure of the invention, the area of the copper layer is large and the thermal resistivity of the aluminum oxide or aluminum nitride is slightly higher than that of the copper, so the total thermal resistance of the heat dissipating structure of the invention is not high and has the good heat dissipating ability.

Figure 7:
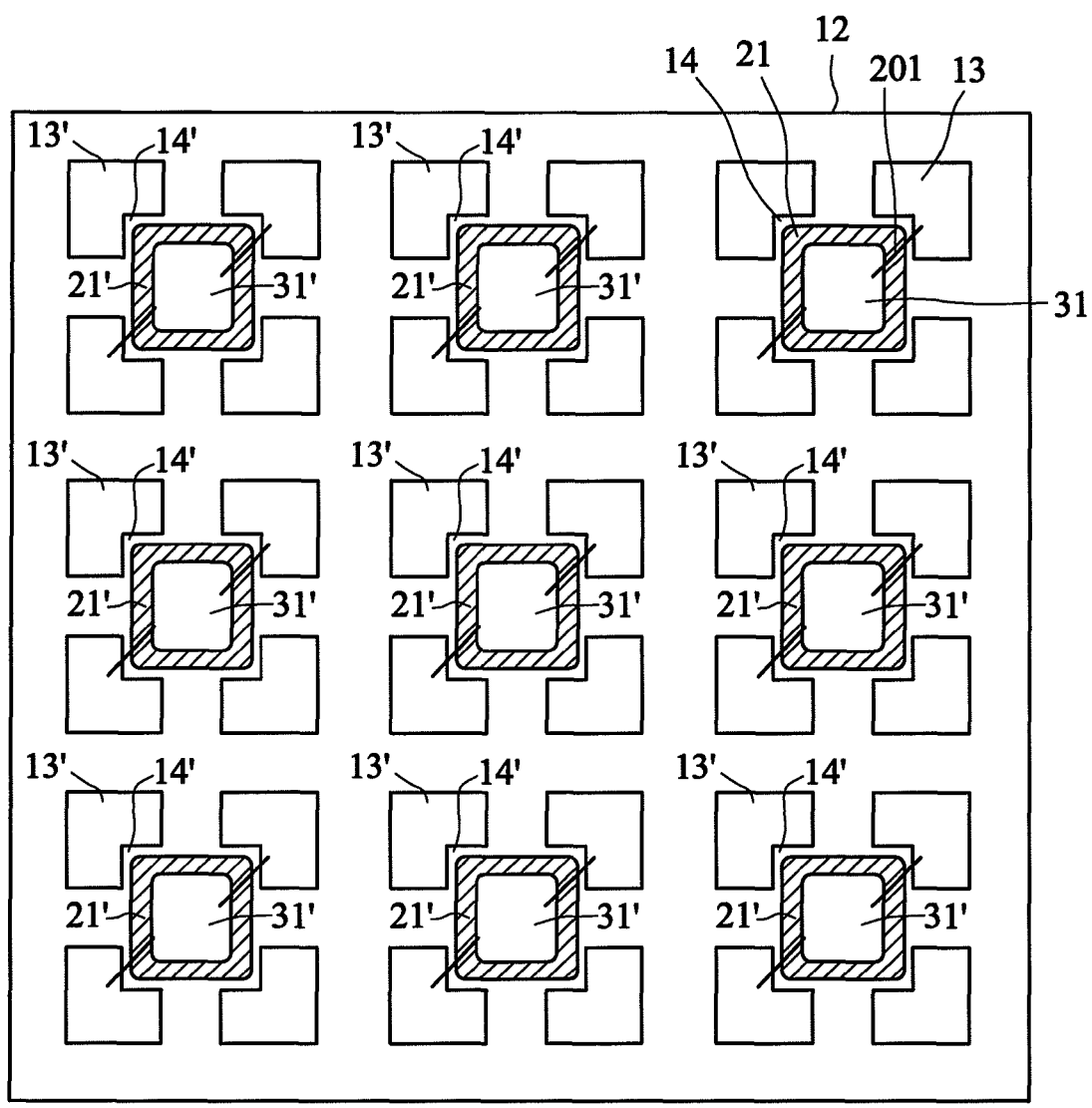
FIG. 7 is a top view showing a package assembly according to a fourth embodiment of the invention.

FIG. 7 is a top view showing a package assembly according to a fourth embodiment of the invention. As shown in FIG. 7, the package assembly is similar to that in the first embodiment except that the package assembly further includes a plurality of additional electronic components 31' respectively disposed in a plurality of additional openings 14' of the patterned upper metal layer 13' and mounted on the electric insulating ceramic layer 12 through additional thermally conductive adhesives or solder 21'. That is, the electronic components and the openings are arranged in an array so that the heat dissipating structure can support more electronic components.

In one example, an aluminum oxide sheet 12 is bonded to and interposed between two copper sheets 11 and 13 to form the three-layer structure having the good heat dissipating property. In detail, the two copper sheets 11 and 13 each having the dimension of 70×20×0.3 mm are pre-oxidized in two stages for several minutes in the air or the passivation atmosphere at the temperature ranging from 200° C. to 600° C., and then jointed to the aluminum oxide substrate 12 with the dimension of 75×26×0.5 mm in the passivation atmosphere at the temperature of 1060° C. for ten minutes. Thus, the first interface IT1 between the lower metal layer 11 and the ceramic layer 12 is the same as the second interface IT2 between the ceramic layer 12 and the upper metal layer 13 but different from a third interface IT3 between the thermally conductive adhesive 21 and the ceramic layer 12. The joined heat dissipating structure has the thickness of 1.1 mm. Then, the thermal conductivity of the structure is measured with a hot disk method with a thermal conductivity analyzer (Omicron Multiprobe Compact, Sweden), and is equal to 244 W/mK. Thus, the heat dissipating structure according to the invention has the excellent heat conducting ability and may be used as the heat dissipating substrate.

In addition, the present invention further provides a solution for the optical, electrical and thermal aspects so that the fully reflective and highly thermoconductive electronic module has the integrated functions.

Figure 8:
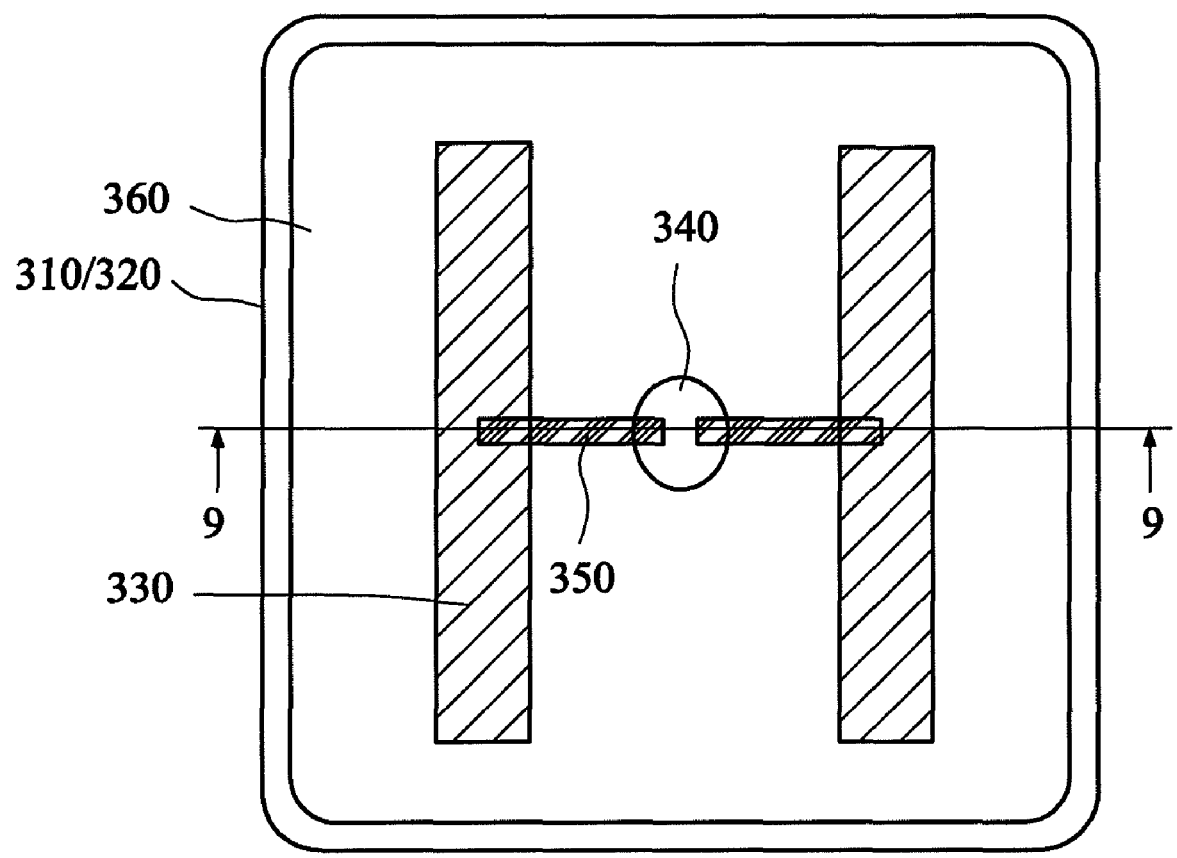
FIG. 8 is a top view showing a fully reflective and highly thermoconductive electronic module according to a preferred embodiment of the present invention.
Figure 9:
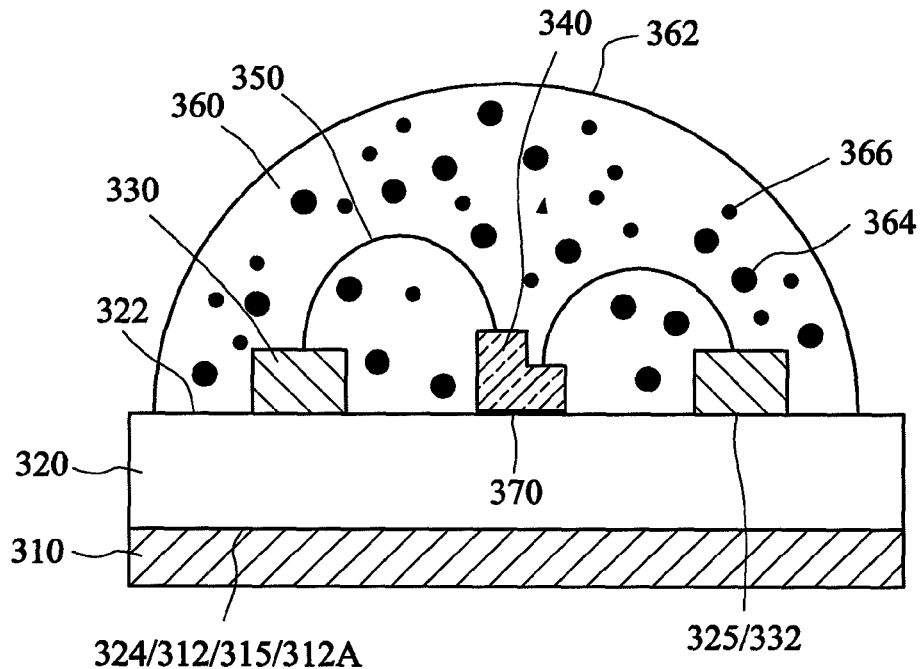
FIG. 9 is a cross-sectional view taken along a line 9-9 of FIG. 8.
Figure 10:
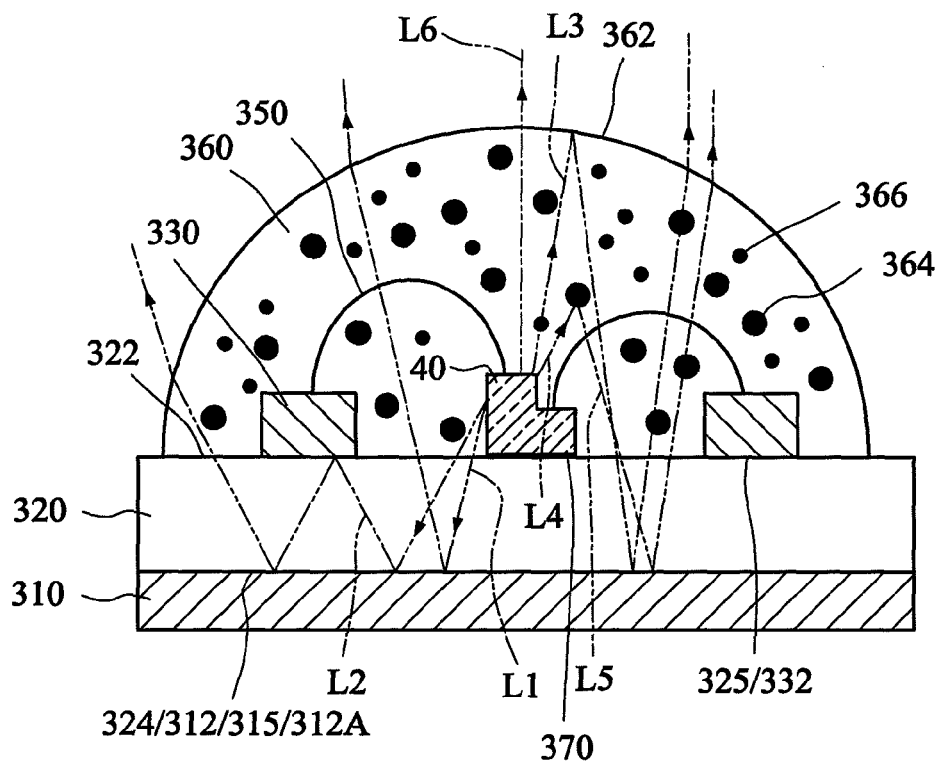
FIG. 10 is a schematic illustration showing the light reflection of FIG. 9.

FIG. 8 is a top view showing a fully reflective and highly thermoconductive electronic module according to a preferred embodiment of the present invention. FIG. 9 is a cross-sectional view taken along a line 9-9 of FIG. 8. FIG. 10 is a schematic illustration showing the light reflection of FIG. 9. Referring to FIGS. 8 to 10, the fully reflective and highly thermoconductive electronic module of the invention includes a metal bottom layer 310, a transparent ceramic layer 320 and a patterned metal wiring layer 330.

The metal bottom layer 310 has a lower reflective surface (also referred to as a first reflective surface) 312. The transparent ceramic layer 320 is composed of sapphire, glass or silicon oxide. The transparent ceramic layer 320 has an upper surface 322 and a lower surface 324, which is bonded to the lower reflective surface 312 of the metal bottom layer 310. The metal bottom layer 310 and the metal wiring layer 330 may be made of the same metal material, such as the highly thermoconductive and highly electroconductive material, or may be made of different metal materials. For example, the metal bottom layer 310 and the metal wiring layer 330 are made of copper, and a first bonding interface 315 between the metal bottom layer 310 and the transparent ceramic layer 320 is the same as a second bonding interface 325 between the transparent ceramic layer 320 and the metal wiring layer 330.

The patterned metal wiring layer 330 is bonded to the upper surface 322 of the transparent ceramic layer 320. The lower reflective surface 312 reflects a first light ray L1, transmitting through the transparent ceramic layer 320, to the upper surface 322 of the transparent ceramic layer 320, and then to the front side of the module.

In this condition, some light rays may be blocked by the metal wiring layer 330. Thus, the metal wiring layer 330 may further have an upper reflective surface (also referred to as a second reflective surface) 332 disposed opposite the lower reflective surface 312. The lower reflective surface 312 reflects a second light ray L2, transmitting through the transparent ceramic layer 320, to the upper reflective surface 332. The upper reflective surface 332 reflects the second light ray L2 to the lower reflective surface 312. Finally, the lower reflective surface 312 reflects the second light ray L2 to transmit through the transparent ceramic layer 320.

The metal bottom layer 310, the transparent ceramic layer 320 and the metal wiring layer 330 may be referred to as a heat dissipating substrate, on which an electrical component may be mounted. Therefore, the fully reflective and highly thermoconductive electronic module may further include an electrical component 340, a plurality of wires 350 and a package material layer 360. The electrical component 340, such as a light-emitting diode (LED), is mounted on the upper surface 322 of the transparent ceramic layer 320, and outputs the first light ray L1. The wires 350 are electrically connected to the electrical component 340 and the metal wiring layer 330. It is noted that the electrical component 340 may also include a sapphire layer.

In order to enhance the heat dissipation efficiency, the electrical component 340 may be mounted on the upper surface 322 of the transparent ceramic layer 320 through a thermally conductive adhesive 370. The thermally conductive adhesive 370 may be regarded as the interface between the electrical component 340 and the transparent ceramic layer 320, and is different from the first bonding interface 315 and the second bonding interface 325. This thermally conductive adhesive may be a transparent or translucent adhesive.

The package material layer 360 covers the transparent ceramic layer 320, the metal wiring layer 330, the electrical component 340 and the wires 350. In this case, the electrical component 340 may further output a third light ray L3. The third light ray L3 is reflected, by a boundary surface 362 of the package material layer 360, back to the transparent ceramic layer 320, and then transmits through the transparent ceramic layer 320. Next, the metal bottom layer 310 reflects the third light ray L3 to transmit through the transparent ceramic layer 320 and the package material layer 360 so that the third light ray L3 is finally output from the package material layer 360.

In addition, the package material layer 360 may include a plurality of fluorescent particles 364 and 366, such as ceramic fluorescent powders. The fluorescent particles 364 and 366 may have different diameters. In this case, the electrical component 340 further outputs a fourth light ray L4. Each fluorescent particle 364/366 receives the fourth light ray L4 and then generates a fifth light ray L5. The fifth light ray L5 transmitting through the transparent ceramic layer 320 is reflected, by the metal wiring layer 330, to transmit through the transparent ceramic layer 320 and the package material layer 360, and is finally output from the package material layer 360.

The method of manufacturing the fully reflective and highly thermoconductive electronic module will be described in the following.

First, the metal bottom layer 310, such as the copper layer, is ground and slightly oxidized so that the metal bottom layer 310 has the lower reflective surface 312. The grinding step is performed to ensure its surface roughness, and the oxidizing step is performed to form a surface oxide layer 312A on the lower reflective surface 312 of the copper sheet. The thickness of the surface oxide layer 312A is smaller than or equal to 6 micrometers to ensure the subsequent light reflecting ability.

Next, the patterned metal wiring layer 330 is provided. The metal wiring layer 330 may be formed on the transparent ceramic layer 320 by way of electroplating, electroless plating, chemical vapor deposition or physical vapor deposition in conjunction with chemical etching or any other removing steps.

Then, the transparent ceramic layer 320 is interposed between the metal wiring layer 330 and the metal bottom layer 310 to form an assembly. At this stage, the transparent ceramic layer 320, the metal wiring layer 330 and the metal bottom layer 310 are only placed together without any bonding relationship.

Next, the assembly is placed in a high-temperature environment to make the transparent ceramic layer 320 bond the metal bottom layer 310 and the metal wiring layer 330 together. The temperature of the high-temperature environment ranges from 1060° C. to 1080° C., and the high-temperature environment has the low partial oxygen pressure.

In another example, it is possible to place the transparent ceramic layer 320 and the metal bottom layer 310 together to form another assembly. At this time, the transparent ceramic layer 320 and the metal bottom layer 310 have no bonding relationship. Next, the assembly is placed in a high-temperature environment so that the transparent ceramic layer 320 is bonded to the metal bottom layer 310. The temperature of the high-temperature environment ranges from 1060° C. to 1080° C., and the high-temperature environment has the low partial oxygen pressure. Then, the metal wiring layer 330 is formed by way of electroplating, electroless plating, chemical vapor deposition, physical vapor deposition in conjunction with etching or any other steps. The bonding step may be performed in the high-temperature environment. Alternatively, the bonding step may also be omitted. Therefore, the metal wiring layer 330 may be bonded to or attached to the transparent ceramic layer 320.

Thus, in this example, the method of manufacturing the fully reflective and highly thermoconductive electronic module includes the following steps. First, the metal bottom layer 310 is ground and oxidized such that the metal bottom layer 310 has the lower reflective surface 312. Then, the transparent ceramic layer 320 is placed on the metal bottom layer 310 with the lower surface 324 of the transparent ceramic layer 320 contacting with the lower reflective surface 312 of the metal bottom layer 310 to form an assembly. Next, the assembly is placed in the high-temperature environment to make the transparent ceramic layer 320 bond to the metal bottom layer 310. Then, the patterned metal wiring layer 330 is formed on the upper surface 322 of the transparent ceramic layer 320. Similarly, the metal wiring layer 330 may be formed on the upper surface 322 of the transparent ceramic layer 320 by way of electroplating, electroless plating, chemical vapor deposition or physical vapor deposition in conjunction with etching or any other removing steps.

When the manufactured composite substrate has the thickness of 1.2 mm, the thermal conductivity of the substrate measured by the flash method (Netzsch LFA 457, Netzsch-Geratebau GmbH) is equal to about 90 W/mK. That is, the thermal conductivity in the direction from the metal bottom layer 310 to the transparent ceramic layer 320 to the patterned metal wiring layer 330 is substantially equal to 90 W/mK, which is significantly higher than the thermal conductivities listed in Table 1. Thus, the copper/transparent-ceramic/copper composite substrate is suitable for the heat dissipating substrate of the LED.

Then, the electrical component 340, such as the LED, may be mounted on the transparent ceramic layer 320.

Next, the wires 350 are provided to electrically connect the electrical component 340 to the metal wiring layer 330.

Finally, the package material layer 360 is provided to cover the transparent ceramic layer 320, the metal wiring layer 330, the electrical component 340 and the wires 350. The fluorescent particles 364 and 366 may be doped in the package material layer 360 to change the light rays output from the LED. For example, the fluorescent particles may convert the blue light rays into the white light rays to serve as the illumination light source.

In order to make the metal wiring layer 330 have the reflecting effect, the metal wiring layer 330 may be ground and oxidized to form the upper reflective surface 332 disposed opposite the lower reflective surface 312.

Therefore, the positive electrode and the negative electrode of the LED may be connected to the metal wiring layer 330. A sixth light ray L6 output from the LED in the frontward direction may be directly output from the package material layer 360. The other light rays L1 to L5 may be reflected or processed by the upper reflective surface 332, the lower reflective surface 312 and the package material layer 360 and then output from the LED in the frontward direction so that the light emitting efficiency of the LED is further enhanced or even a fully reflecting effect may be obtained. The heat output from the LED may be transferred to the transparent ceramic layer 320 and the metal bottom layer 310 through the thermally conductive adhesive 370 and finally reaches the heat dissipating fins or heat pipes in contact with the metal bottom layer 310.

Figure 11:
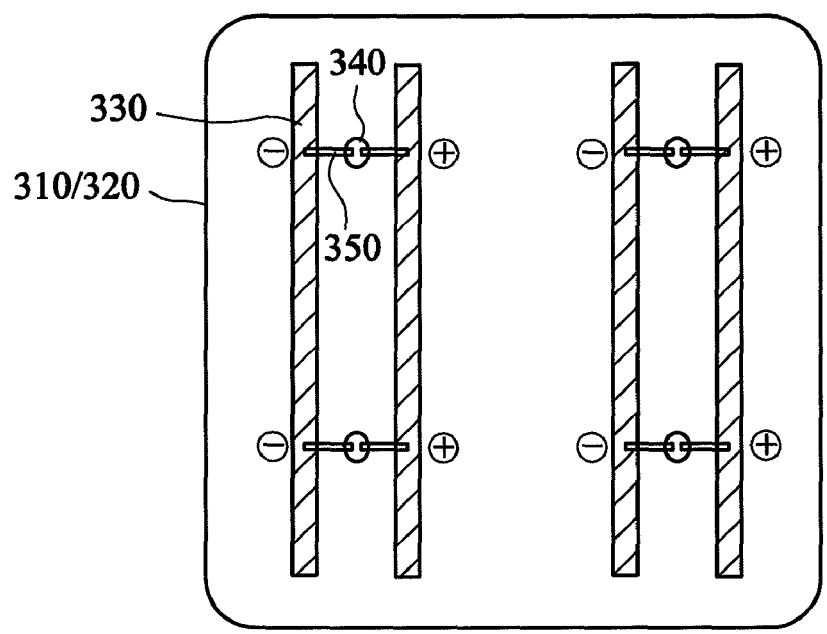
FIGS. 11 and 12 show other implementations of the fully reflective and highly thermoconductive electronic module according to the present invention.
Figure 12:
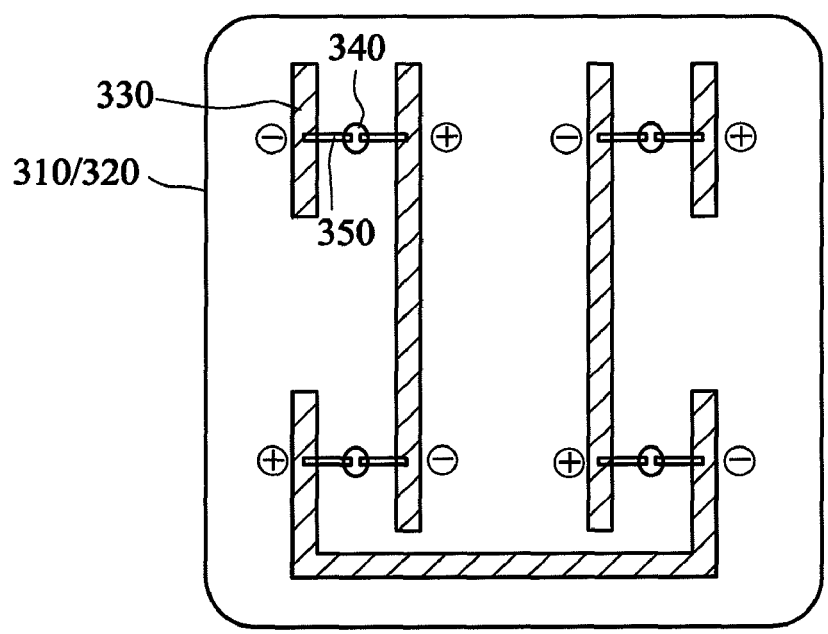

FIGS. 11 and 12 show other implementations of the fully reflective and highly thermoconductive electronic module according to the present invention. As shown in FIGS. 11 and 12, multiple LEDs may be formed on the metal bottom layer 310, and these LEDs may be powered through the metal wiring layer 330. These LEDs may be connected in parallel, as shown in FIG. 11, or may be connected in serial, as shown in FIG. 12.

Figure 13:
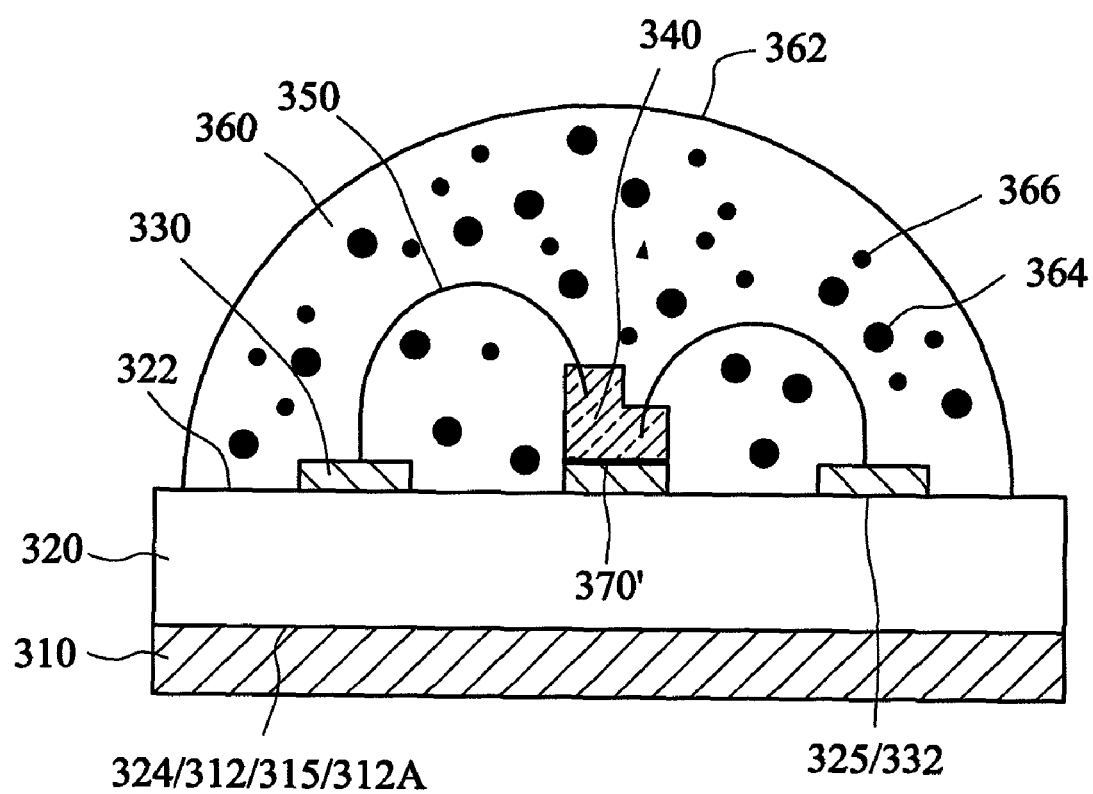
FIG. 13 shows another modification of FIG. 9.

FIG. 13 shows another modification of FIG. 9. As shown in FIG. 13, the difference between this modification and FIG. 9 is that the electrical component 340 is mounted on the metal wiring layer 330. In this example, the electrical component 340 is mounted on the metal wiring layer 330 through a solder 370'. Alternatively, the electrical component 340 may also be mounted on the metal wiring layer 330 directly through the thermally conductive adhesive 370.

Therefore, the fully reflective and highly thermoconductive electronic module of the present invention can enhance the heat dissipating ability, enhance the light reflection ability, and simultaneously enhance the electrical connection ability. So, the present invention is very suitable for the application of the LED field to enhance the light emitting efficiency of the LED product.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A fully reflective and highly thermoconductive electronic module, comprising:
    a metal bottom layer having a first reflective surface;
    a transparent ceramic layer having an upper surface and a lower surface, wherein the lower surface of the transparent ceramic layer is bonded to the first reflective surface of the metal bottom layer; and
    a patterned metal wiring layer disposed on the upper surface of the transparent ceramic layer, wherein the first reflective surface reflects a first light ray, transmitting through the transparent ceramic layer, to the upper surface of the transparent ceramic layer, the metal wiring layer has a second reflective surface, the second reflective surface is disposed opposite the first reflective surface the first reflective surface reflects a second light ray, transmitting through the transparent ceramic layer, to the second reflective surface, and the second reflective surface reflects the second light ray to the first reflective surface, which finally reflects the second light ray to transmit through the transparent ceramic layer.

2. The electronic module according to claim 1, wherein the metal wiring layer is bonded to the upper surface of the transparent ceramic layer.

3. The electronic module according to claim 2, wherein the metal bottom layer and the metal wiring layer are made of copper, and a first bonding interface between the metal bottom layer and the transparent ceramic layer is the same as a second bonding interface between the transparent ceramic layer and the metal wiring layer.

4. The electronic module according to claim 1, wherein the transparent ceramic layer is composed of sapphire, glass or silicon oxide.

5. The electronic module according to claim 1, further comprising:
    an electrical component, mounted on the upper surface of the transparent ceramic layer or the metal wiring layer, for outputting the first light ray; and
    a plurality of wires, electrically connected to the electrical component and the metal wiring layer.

6. The electronic module according to claim 5, wherein the electrical component is mounted on the metal wiring layer through a transparent or translucent thermally conductive adhesive or a solder.

7. The electronic module according to claim 5, wherein the electrical component is mounted on the upper surface of the transparent ceramic layer through a transparent or translucent thermally conductive adhesive.

8. The electronic module according to claim 5, further comprising:
    a package material layer covering the transparent ceramic layer, the metal wiring layer, the electrical component and the wires, wherein the electrical component further outputs a third light ray, the third light ray is reflected, by a boundary surface of the package material layer, back to the transparent ceramic layer and transmits through the transparent ceramic layer, and is reflected, by the metal bottom layer, to transmit through the transparent ceramic layer and the package material layer, and then the third light ray is output from the package material layer.

9. The electronic module according to claim 5, further comprising:
    a package material layer covering the transparent ceramic layer, the metal wiring layer, the electrical component and the wires, wherein the package material layer comprises a plurality of fluorescent particles.

10. The electronic module according to claim 9, wherein the electrical component further outputs a fourth light ray, each of the fluorescent particles receives the fourth light ray and then generates a fifth light ray, the fifth light ray transmits through the transparent ceramic layer and is then reflected, by the metal wiring layer, to transmit through the transparent ceramic layer and the package material layer, and finally output from the package material layer.

11. A method of manufacturing a fully reflective and highly thermoconductive electronic module, the method comprising the steps of:
    grinding and oxidizing a metal bottom layer to make the metal bottom layer have a first reflective surface;
    providing a patterned metal wiring layer;
    interposing a transparent ceramic layer between the metal wiring layer and the metal bottom layer to form an assembly; and
    placing the assembly in a high-temperature environment to make the transparent ceramic layer bond the metal bottom layer and the metal wiring layer together, so that the fully reflective and highly thermoconductive electronic module comprises:
    providing the metal bottom layer with the first reflective surface;
    bonding a lower surface of the transparent ceramic layer to the first reflective surface of the metal bottom layer; and
    disposing the patterned metal wiring layer on an upper surface of the transparent ceramic layer, wherein the first reflective surface reflects a first light ray, transmitting through the transparent ceramic layer, to the upper surface of the transparent ceramic layer, the metal wiring layer has a second reflective surface, the second reflective surface is disposed opposite the first reflective surface, the first reflective surface reflects a second light ray, transmitting through the transparent ceramic layer, to the second reflective surface, and the second reflective surface reflects the second light ray to the first reflective surface, which finally reflects the second light ray to transmit through the transparent ceramic layer.

12. The method according to claim 11, wherein a temperature of the high-temperature environment ranges from 1060° C. to 1080° C.

13. The method according to claim 11, further comprising the steps of:
    mounting an electrical component onto the transparent ceramic layer; and
    providing a plurality of wires to electrically connect the electrical component to the metal wiring layer.

14. The method according to claim 13, further comprising the steps of:
    covering the transparent ceramic layer, the metal wiring layer, the electrical component and the wires with a package material layer.

15. The method according to claim 11, wherein the step of providing the metal wiring layer comprises:
    grinding and oxidizing the metal wiring layer to form the second reflective surface disposed opposite the first reflective surface.

16. A method of manufacturing a fully reflective and highly thermoconductive electronic module, the method comprising the steps of:

grinding and oxidizing a metal bottom layer to make the metal bottom layer have a first reflective surface;

combining a transparent ceramic layer with the metal bottom layer with a lower surface of the transparent ceramic layer contacting with the first reflective surface of the metal bottom layer to form an assembly;

placing the assembly in a high-temperature environment to bond the transparent ceramic layer to the metal bottom layer; and forming a patterned metal wiring layer on an upper surface of the transparent ceramic layer, so that the fully reflective and highly thermoconductive electronic module comprises:

providing the metal bottom layer with the first reflective surface;

bonding the lower surface of the transparent ceramic layer to the first reflective surface of the metal bottom layer; and disposing the patterned metal wiring layer on the upper surface of the transparent ceramic layer, wherein the first reflective surface reflects a first light ray, transmitting through the transparent ceramic layer, to the upper surface of the transparent ceramic layer, the metal wiring layer has a second reflective surface, the second reflective surface is disposed opposite the first reflective surface, the first reflective surface reflects a second light ray, transmitting through the transparent ceramic layer, to the second reflective surface, and the second reflective surface reflects the second light ray to the first reflective surface, which finally reflects the second light ray to transmit through the transparent ceramic layer.

* * * * *